US012331400B2

(12) United States Patent
Chuang et al.

(10) Patent No.: US 12,331,400 B2
(45) Date of Patent: Jun. 17, 2025

(54) SURFACE TREATMENT APPARATUS

(71) Applicant: CREATING NANO TECHNOLOGIES, INC., Tainan (TW)

(72) Inventors: Ming-Yueh Chuang, Tainan (TW); Chau-Nan Hong, Tainan (TW); Yu-Chi Chang, Tainan (TW)

(73) Assignee: CREATING NANO TECHNOLOGIES, INC., Tainan (TW)

( * ) Notice: Subject to any disclaimer, the term of this patent is extended or adjusted under 35 U.S.C. 154(b) by 470 days.

(21) Appl. No.: 18/053,368

(22) Filed: Nov. 7, 2022

(65) Prior Publication Data

US 2024/0150896 A1    May 9, 2024

(51) Int. Cl.
| | | |
|---|---|---|
| *C23C 16/455* | (2006.01) | |
| *C23C 16/458* | (2006.01) | |
| *C23C 16/52* | (2006.01) | |

(52) U.S. Cl.
CPC .... *C23C 16/45548* (2013.01); *C23C 16/4584* (2013.01); *C23C 16/4586* (2013.01); *C23C 16/52* (2013.01)

(58) Field of Classification Search
CPC .......... C23C 16/4586; C23C 16/45548; C23C 16/4584; C23C 16/45551; C23C 16/45536
See application file for complete search history.

(56) References Cited

U.S. PATENT DOCUMENTS

| | | | |
|---|---|---|---|
| 6,090,248 A | * | 7/2000 | White .................. C23C 14/505 |
| | | | 204/192.12 |
| 2010/0055315 A1 | | 3/2010 | Honma |
| 2014/0004713 A1 | | 1/2014 | Igeta et al. |

FOREIGN PATENT DOCUMENTS

| | | |
|---|---|---|
| CN | 1598048 A | 3/2005 |
| CN | 101736319 A | 6/2010 |
| CN | 105448637 A | 3/2016 |
| CN | 109943828 A | 6/2019 |
| CN | 111218669 A | 6/2020 |
| CN | 111225995 A | 6/2020 |
| CN | 112349619 A | 2/2021 |
| CN | 112352308 A | 2/2021 |
| CN | 112981356 A | 6/2021 |
| DE | 19642852 A1 | 4/1998 |
| DE | 102008062332 A1 | 6/2010 |

(Continued)

*Primary Examiner* — Joseph A Miller, Jr.
(74) *Attorney, Agent, or Firm* — CKC & Partners Co., LLC

(57) ABSTRACT

A high-speed, uniform and high-quality surface treatment apparatus is described. The surface treatment apparatus includes a fixed hollow cylindrical chamber body and a rotatable polygonal prism inside the chamber body. Several flat-substrate holders are symmetrically disposed on the prism surface. The substrate holders revolve as the prism rotates. On the fixed chamber wall, several gas inlet channels, pumping channels and processing units are installed according to the symmetric configuration of the substrate holders. Then, as the substrate holders revolve, the surface treatment processes will occur periodically, including the injection of gas reactants into, the activation of gases in, and the pumping of after-reaction gases out of the processing spaces, defined by the substrate holders and the chamber wall. The substrates will therefore undergo many cycles of periodic surface treatment processes.

8 Claims, 3 Drawing Sheets

(56) References Cited

FOREIGN PATENT DOCUMENTS

| | | |
|---|---|---|
| JP | 2003105538 A | 4/2003 |
| JP | 2007119840 A | 5/2007 |
| JP | 2008028270 A | 2/2008 |
| JP | 2013235947 A | 11/2013 |
| JP | 2018154866 A | 10/2018 |
| KR | 20170069013 A | 6/2017 |

* cited by examiner

SURFACE TREATMENT APPARATUS

BACKGROUND

Field of Invention

The present invention relates to a surface treatment technology, and more particularly, to a surface treatment apparatus.

Description of Related Art

An atomic layer deposition technology is a kind of surface treatment technology that has attracted considerable attention in recent years. In the atomic layer deposition technology, two different precursors involved in the reaction are introduced into a process reaction chamber separately thus the different kinds of precursors will not be present simultaneously in the same space to react with each other in the gas phase, and the precursor introduced later into the reactor will only react with the earlier precursor adsorbed on the substrate surface, such that a self-limiting effect of deposition is achieved. That is, one layer of the precursor adsorbed on a surface of a substrate only chemically reacts with the other introduced precursor, and the reaction is limited to one atomic layer on the surface of the substrate by preventing the reaction between the same precursors. Then, the excess precursors and by-products need to be completely purged by using an inert gas such as argon (Ar) or nitrogen ($N_2$) to remove the residual precursors before introducing another precursor. The two precursors are introduced in turn to form a cycle.

A basic atomic layer deposition process cycle includes four steps. The first precursor is first introduced to a surface of a substrate in a process reaction chamber, the first precursor is chemically adsorbed on the surface of the substrate due to hydrophilic functional groups on the surface of the substrate, and when the adsorption of the surface of the substrate is saturated, the adsorption automatically stops. Next, a purge operation is performed by using an inert gas, such as argon or nitrogen, to remove the excess first precursor and by-products in the reactor. Then, the second precursor is introduced to the surface of the substrate, and a chemical reaction between the second precursor and the first precursor adsorbed on the surface of the substrate is driven by an appropriately high temperature on the substrate to form a thin film. Subsequently, a purge operation is performed by using an inert gas, such as argon or nitrogen, to remove the excess second precursor and by-products in the reactor.

The above four steps form a cycle. Each cycle deposits a monoatomic layer of the first precursor and a monoatomic layer of the second precursor to form a monomolecular layer. This cycle is repeated many times to increase the thickness of the deposited layer, and the number of deposited molecular layers can be precisely controlled by controlling the number of cycles. In addition, the deposition of each atom layer is a surface reaction without a gas phase reaction, such that a topography of the deposited film layer is the same as that of the substrate, and a thickness of the deposited film is the same in each position, such that there is no problem of uneven film thickness distribution caused by a three-dimensional structure, such as holes with different depths or protrusions with different heights. However, because only one monomolecular layer (two monoatomic layers) is deposited in each cycle, it is time-consuming and the yield is very low, which is the most difficult problem to overcome for a long time.

SUMMARY

Therefore, one objective of the present disclosure is to provide a surface treatment apparatus. The apparatus includes a hollow cylindrical chamber body with a rotatable polygonal hollow prism inside, and several substrate holders, which can hold various flat substrates, are symmetrically disposed on the prism. When the hollow prism rotates around a central axis of the chamber, each of the substrate holders revolves around the axis. Each revolution represents that the substrates on the substrate holders have completed one or more cycles at the same time, and the number of completed cycles is proportional to the number of the revolutions. Therefore, multiple cycles of surface treatment processes can be performed on multiple substrates at the same time, which can greatly improve the efficiency of the surface treatment.

Another objective of the present disclosure is to provide a surface treatment apparatus, in which a rotation axis of the substrate holders is not parallel to a normal line of a carrying surface of the substrate holder, for example, the rotation axis is not parallel to the normal line of the carrying surface of the substrate holder, such that the structure of the apparatus is simple and small, and the footprint is small, which can make the planning of the plant space more flexible to enhance the space efficiency of the plant. In addition, the surface treatment apparatus can include plural stacked substrate holders, such that the surface treatment can be performed on more substrates at the same time, thereby greatly enhancing the efficiency and the production capacity of the surface treatment apparatus.

Still another objective of the present disclosure is to provide a surface treatment apparatus, in which the rotation axis of the substrate holder is not parallel to the normal line of the carrying surface of the substrate holder, such that there is no speed difference between the substrates carried by the substrate holder relative to the rotating axis of the substrate holder, there is no speed difference in the movement of each area of a single substrate, and there is no speed difference among all of the substrates in the same process batch. Therefore, the processing time required for the substrates is exactly the same, which not only enhances the uniformity of the surface treatment of the substrates, but also avoids waste of the processing space.

Yet another objective of the present disclosure is to provide a surface treatment apparatus, in which each of the substrate holders can form a small processing chamber with a fixed inner wall of the main chamber body, and many gas holes are arranged on the inner wall of the main chamber body. When the hollow prism rotates, each processing chamber rotates along the inner wall, and (1) first passes through the gas supply hole, such that the gas reactant can be injected into the processing chamber to react on the substrate surface; (2) next passes through a gas or substrate activation device, such as a plasma generator or an infrared heating device, to accelerate the surface reaction; (3) then passes through the gas extraction port to pump out the gas after the reaction to reduce the gas residue; and (4) passes through several gas supply ports for inert gases, such as argon or nitrogen, in which these gas supply ports form a gas exhausting curtain, which can isolate the adjacent processing chambers to prevent the gases from mixing with each other and destroying the original reaction mechanism, resulting in deterioration of the film quality. Therefore, after each of the processing chambers rotates with the rotation of the prism to complete the four steps of gas injecting, reacting, pumping, and purging, a single atomic layer can just be deposited, in which the types of the deposited elements can be determined by the choice of reaction precursors. As long as the reaction precursor is replaced, after repeating the above four steps, a monatomic layer of another element can be deposited. The two deposition procedures are combined into a cycle, which just deposits a monomolecular layer formed by two kinds of elements. As long as the number of rotations of the substrate is controlled, the number of cycles of the deposition reaction of the molecular layers can be controlled, such that the deposition number of the molecular layers can be accurately controlled. In addition, the faster the rotation rate is, the faster the deposition rate is. In addition to pumping, the present disclosure additionally performs a gas curtain isolation step to ensure that the gases in the processing chambers will not mix with each other when the processing chambers rotate at a high speed. Accordingly, as the deposition rate is increased, the film quality is guaranteed.

Further another objective of the present disclosure is to provide a surface treatment apparatus, in which the processing chamber above the substrates has a very small volume, which is much smaller than the conventional apparatus. For the polygonal hollow prism in the cylindrical hollow chamber, a length of the longest diagonal line must be smaller than an inner diameter of the hollow chamber, but the closer to the inner diameter of the hollow chamber, the better. In addition, the polygonal hollow prism is not a general tetrahedron, hexahedron, or any regular polyhedron, but is a mixture of circle and planes formed by symmetrically cutting off several edges of the hollow cylinder, as shown in FIG. 1. Thus, planar substrate holders can be disposed on the polygonal hollow prism to hold planar substrates, such as silicon or sapphire wafers, etc. This design minimizes the space of the processing chamber to a theoretical minimum for the planar substrates. When the space of the processing chamber is at a minimum, the time required for the processing chamber to be filled with the surface treatment gas and the post-reaction gas to be pumped out is also minimal. Therefore, when the processing chamber rotates at a very high speed, the surface treatment gas can still completely fill the processing chamber to ensure a complete surface reaction, and the residual gas after the reaction can be exhausted quickly from the processing chamber to prevent the gas from remaining in the next step, causing mixing with the newly-injected gas reactants and thus damaging the film quality. The gas curtain can isolate the adjacent processing chambers and prevent gases from mixing with each other. In order to increase the surface treatment rate to the greatest value, the substrate rotation rate can be greatly increased to an extremely high value. In this case, the shrinking of the processing chamber space becomes very important in order to avoid gas mixing and achieve a high-speed and high-quality surface treatment.

According to the above objectives, the present disclosure provides a surface treatment apparatus. The surface treatment apparatus includes a chamber body and a rotatable hollow prism. The prism has at least one substrate holder, and each holder is equipped with a processing module. The chamber body has a chamber. There are plural fluid channels on a wall of the chamber body, and the gas or liquid can flow from an outside of the chamber body to the chamber through the channels. The channels are distributed symmetrically and surround the entire chamber wall. Through the rotation of the hollow prism around its central axis in the chamber, the substrate holder revolves around the same axis. The prism may include plural substrate holders, and there may be a partition between two adjacent substrate holders. The holders are disposed around an outer side surface of the hollow prism, and are configured to carry more than one substrate. Each of the holders and an inner side surface of the wall of the chamber body define a processing chamber. The specific surface treatment agents enter the processing chambers through the pipelines of the wall of the chamber body with the using of the activation devices to promote the surface reaction of the substrates. The activation devices can provide specific light sources, plasma, or energy to generate electrons, ions, or free radicals in the gas phase. The activation devices can also directly activate the substrates by, for example, bombarding the substrates with electrons or ions or heating the substrates with infrared rays.

According to one embodiment of the present disclosure, the surface treatment agents are different from each other.

According to one embodiment of the present disclosure, the surface treatment agents supplied by the processing modules through adjacent gas channels are different, and the surface treatment agents supplied through the gas channels adjacent to the same one of the gas channels are the same.

According to one embodiment of the present disclosure, the surface treatment apparatus further includes a gas device. The substrate holder has an accommodation space and plural gas holes, and the gas holes pass through the main body and fluidly connect the accommodation space and the chamber. The gas device is configured to form gas curtains between the processing chambers via the accommodation space and the gas holes.

According to one embodiment of the present disclosure, the chamber body is provided with nozzles for flushing inside with gas to purge the substrate holders.

According to one embodiment of the present disclosure, the surface treatment apparatus further includes at least one gas pumping device, which passes through the chamber body and is located between the two adjacent gas channels.

According to one embodiment of the present disclosure, the surface treatment apparatus further includes a heating device. The substrate holder has an accommodation space, and the heating device is disposed in the accommodation space and is configured to heat the substrates.

According to one embodiment of the present disclosure, the surface treatment apparatus further includes plural plasma devices, which are disposed in the chamber and correspondingly adjacent to the gas channels.

According to one embodiment of the present disclosure, each of the plasma devices includes two coils, which are respectively located at opposite sides of the corresponding gas channel.

According to one embodiment of the present disclosure, each of the plasma devices includes one coil, and the coil surrounds an outside of the corresponding gas channel.

According to one embodiment of the present disclosure, a normal line of a carrying surface of each of the holders is substantially non-parallel to the rotation axis of the substrate holders.

According to one embodiment of the present disclosure, a number of the substrate holders is plural, and the substrate holders are stacked on each other.

According to the above objectives, the present disclosure provides a surface treatment apparatus. The surface treatment apparatus includes a chamber body, at least one rotatable hollow prism, and plural processing modules. The chamber body has a chamber and plural gas channels. The gas channels pass through the chamber body, surround the chamber, and are fluidly connected to the chamber. The at least one rotatable hollow prism is disposed in the chamber. The at least one rotatable hollow prism includes a main body and plural substrate holders. The main body includes plural partitions. The substrate holders are disposed on an outer side surface of the main body and are configured to hold plural substrates. The partitions are respectively located between the adjacent substrate holders. Each of the substrate holders and an inner side surface of the chamber body define a processing chamber. The processing modules are configured to supply plural surface treatment agents to the processing chambers respectively through the gas channels. A normal line of a carrying surface of each of the substrate holders is non-parallel to a rotation axis of the at least one rotatable hollow prism. When a surface treatment process is performed, the at least one rotatable hollow prism rotates, such that each of the substrates is sequentially exposed to the surface treatment agents, in which as each of the substrates rotates away from the position facing the original gas channel to reach the new position facing the next gas channel, a gas pumping action is performed on the processing chamber where the substrate is located.

According to one embodiment of the present disclosure, the surface treatment apparatus further includes at least one gas pumping device passing through the chamber body and located between adjacent two of the gas channels.

According to one embodiment of the present disclosure, the surface treatment apparatus further includes a gas device, in which the at least one rotatable hollow prism has an accommodation space and plural gas holes, the gas holes pass through the main body and fluidly connect the accommodation space and the chamber, and gas flows from the accommodation space to the chamber. The gas device is configured to form plural gas curtains between the processing chambers via the accommodation space and the gas holes to isolate the processing chambers to prevent the surface treatment agents in the processing chambers from mixing with each other.

According to one embodiment of the present disclosure, the surface treatment agents are the same or different from each other.

According to one embodiment of the present disclosure, the surface treatment apparatus further includes a heating device, in which the at least one rotatable hollow prism has an accommodation space, and the heating device is disposed in the accommodation space and is configured to heat the substrates.

According to one embodiment of the present disclosure, the surface treatment apparatus further includes one single or plural activation devices, in which the activation devices can provide thermal energy, plasma, or electromagnetic radiation, and are disposed in the chamber adjacent to the gas channels.

According to one embodiment of the present disclosure, a number of the at least one rotatable hollow prism is plural, and the rotatable hollow prisms are stacked on each other.

According to one embodiment of the present disclosure, the chamber body is a non-conductive chamber body, and the surface treatment apparatus includes a coil surrounding the non-conductive chamber body, and the coil is configured to be connected to a high-frequency power supply to generate inductive heating or inductively coupled plasma in the chamber body, in which a frequency of the high-frequency power supply is less than 10 KHz.

BRIEF DESCRIPTION OF THE DRAWINGS

In order to make the above and other objectives, features, advantages, and embodiments of the present disclosure more comprehensible, the accompanying drawings are described as follows.

DETAILED DESCRIPTION

Multi-cycle surface treatment techniques, such as atomic layer deposition or atomic layer etching, are gaining in importance but have long suffered from slow process rates. The ongoing surface reaction will be destroyed by the residual gas from the previous step, resulting in the deterioration of the quality of the surface treatment. In order to speed up the cycle speed to increase the surface treatment rate, it is necessary to avoid the problem of gas mixing in different steps. The apparatus is designed with appropriate gas intake and extraction and gas curtains, which can quickly fill and purge and completely isolate processing chambers, such that it can prevent the gases of different steps from mixing with each other under a high-speed circulation. A shape of a rotatable hollow prism is designed to minimize a space of each of processing chambers formed by planar substrate holders and a wall of a chamber body, such that the time required for filling the processing chambers with the reaction gas and pumping out the gas after the reaction can be effectively reduced. Therefore, when the flat substrate rotates at a higher speed, it still can achieve complete surface reaction and avoid gas residue, thereby achieving a high-speed and high-quality surface treatment. In addition, compared with the traditional spatial atomic layer deposition system, the application of the present system can greatly reduce the footprint, carry more substrates, enhance mass production capacity, and obtain more uniform surface treatment quality.

Figure 1:
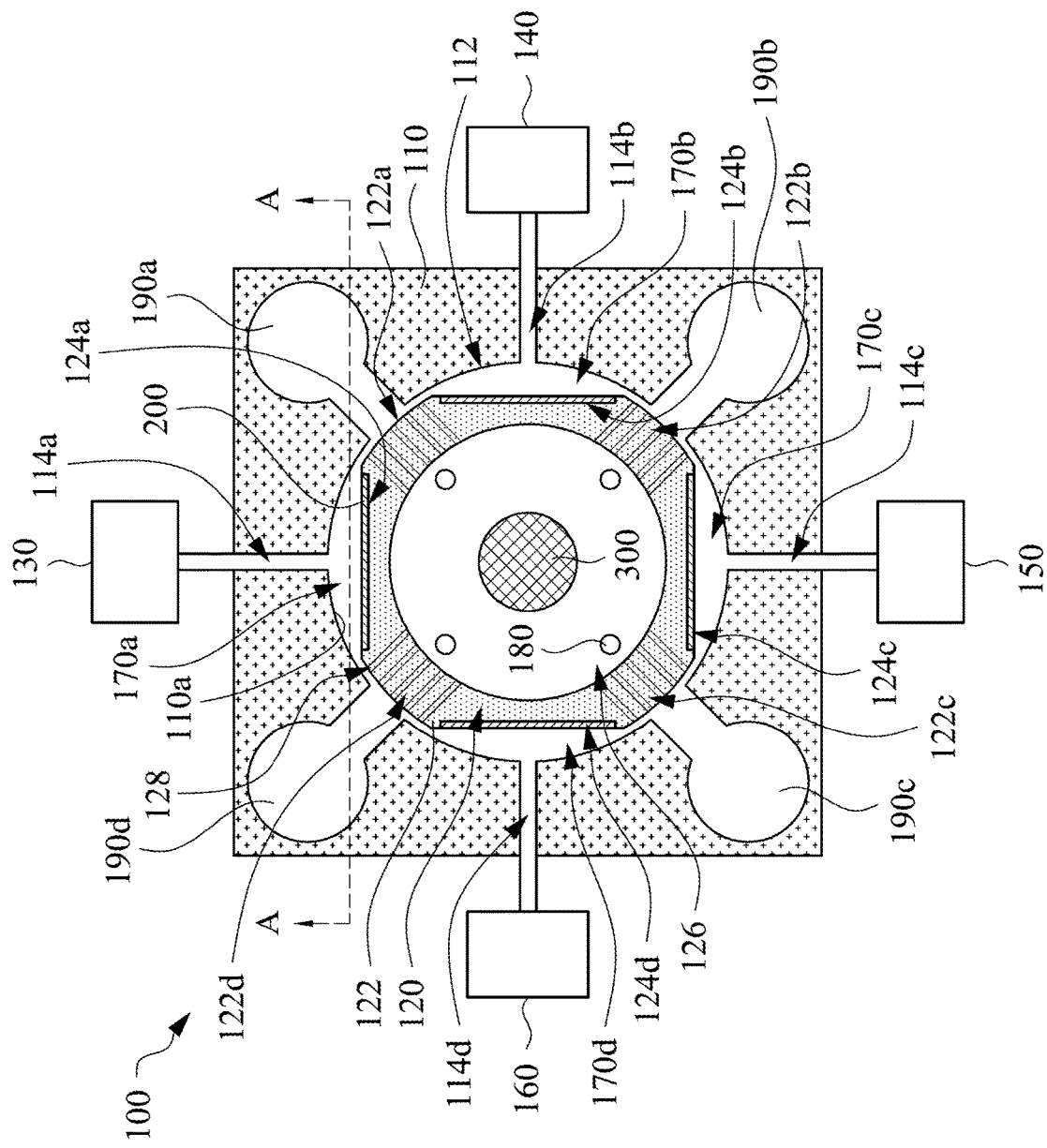
FIG. 1 is a schematic diagram of a surface treatment apparatus in accordance with one embodiment of the present disclosure.

Referring to FIG. 1, FIG. 1 is a schematic diagram of a surface treatment apparatus in accordance with one embodiment of the present disclosure. A surface treatment apparatus 100 of the present embodiment can perform surface treatments, such as deposition, etching, modification, and cleaning, on substrates 200. The surface treatment apparatus 100 may be used in surface treatment processes that use different treatment agents and need to isolate the applied treatment agents from each other. For example, the surface treatment apparatus 100 may perform an atomic layer deposition process on the substrates 200.

The surface treatment apparatus 100 mainly includes a chamber body 110, a rotatable hollow prism 120, and plural processing modules. The chamber body 110 has a chamber 112 and plural gas channels. In some examples, the number of the processing modules in the surface treatment apparatus 100 is the same as the number of the gas channels in the chamber body 110. For example, the surface treatment apparatus 100 includes four processing modules 130, 140, 150, and 160, and the chamber body 110 includes four gas channels 114a, 114b, 114c, and 114d. The gas channels 114a, 114b, 114c, and 114d pass through the chamber body 110, and the gas channels 114a, 114b, 114c, and 114d surround the chamber 112 in sequence, for example, sequentially surround the chamber 112 in a clockwise direction. The gas channels 114a, 114b, 114c, and 114d are fluidly connected to the chamber 112.

The rotatable hollow prism 120 is disposed in the chamber 112 of the chamber body 110, and can rotate in the chamber 112, i.e. the rotatable hollow prism 120 rotates around a central axis of the rotatable hollow prism 120. The rotatable hollow prism 120 may mainly include a main body 122 and plural substrate holders. For example, as shown in FIG. 1, the rotatable hollow prism 120 includes four substrate holders 124a, 124b, 124c, and 124d. The main body 122 includes plural partitions. The partitions of the main body 122 are used to separate the substrate holders 124a, 124b, 124c, and 124d, so the main body 122 includes four partitions 122a, 122b, 122c, and 122d, which are in the same number as the substrate holders 124a, 124b, 124c, and 124d. In the main body 122, the partitions 122a, 122b, 122c, and 122d are sequentially arranged, that is, sequentially arranged in the clockwise direction. When the rotatable hollow prism 120 is disposed in the chamber 112, a distance between the partitions 122a, 122b, 122c, and 122d and an inner side surface 110a of the chamber body 110 may be, for example, about 0 to about 100 mm.

The substrate holders 124a, 124b, 124c, and 124d are arranged around an outer side surface of the main body 122. For example, he substrate holders 124a, 124b, 124c, and 124d are sequentially disposed on the outer side surface of the main body 122 in a clockwise direction. The partition 122a is between the adjacent substrate holders 124a and 124b, the partition 122b is between the adjacent substrate holders 124b and 124c, and the partition 122c is between the adjacent substrate holders 124c and 124d, the partition 122d is interposed between the adjacent substrate holders 124d and 124a.

The distance between the substrate holders 124a, 124b, 124c, and 124d and the inner side surface 110a of the chamber body 110 is greater than the distance between the partitions 122a, 122b, 122c, and 122d and the inner side surface 110a of the chamber body 110. In some examples, in the manufacturing of the rotatable hollow prism 120, four planar areas can be formed as the substrate holders 124a, 124b, 124c, and 124d by milling out an outer sidewall of a hollow cylinder, and the unremoved portions of the outer sidewall of the hollow cylinder are the partitions 122a, 122b, 122c, and 122d. A normal line of a carrying surface of each of the substrate holders 124a, 124b, 124c, and 124d is not parallel to the rotation axis of the rotatable hollow prism 120. In some exemplary examples, the normal line of the carrying surface of each of the substrate holders 124a, 124b, 124c, and 124d is substantially non-parallel to the rotation axis of the rotatable hollow prism 120. The substrate holders 124a, 124b, 124c, and 124d can respectively carry and hold one or more substrates 200.

The rotation axis of the rotatable hollow prism 120 is not parallel to the normal lines of the carrying surfaces of the substrate holders 124a, 124b, 124c, and 124d, such that the structure of the surface treatment apparatus 100 is small and simple, and the overall structure occupies a small floor area, which can make the planning of the plant space more flexible, thereby improving the space efficiency of the plant.

Each of the substrate holders 124a, 124b, 124c, and 124d can define a processing chamber with the inner side surface 110a of the chamber body 110. The substrate holder 124a and the inner side surface 110a of the cavity 110 collectively define a processing chamber 170a. The substrate holder 124b and the inner side surface 110a of the cavity 110 collectively define a processing chamber 170b. The substrate holder 124c and the inner side surface 110a of the cavity 110 collectively define a processing chamber 170c. The substrate holder 124d and the inner side surface 110a of the cavity 110 collectively define a processing chamber 170d.

The processing modules 130, 140, 150, and 160 are respectively fluidly connected to the gas channels 114a, 114b, 114c, and 114d of the chamber body 110, and can supply the processing chambers 170a, 170b, 170c, and 170d with surface treatment agents via the gas channels 114a, 114b, 114c, and 114d respectively. In some examples, the surface treatment agents supplied by the treatment modules 130, 140, 150, and 160 are different from each other.

In other examples, different surface treatment agents are supplied through the adjacent ones of the gas channels 114a, 114b, 114c, and 114d by the treatment modules 130, 140, 150, and 160, and the same surface treatment agent is supplied through the gas channels 114a, 114b, 114c, and 114d that are adjacent to the same one of the gas channels 114a, 114b, 114c, and 114d. For example, different surface treatment agents are supplied through the adjacent gas channels 114a and 114b, and the same surface treatment agent is supplied through the gas channels 114a and 114c which both are adjacent to the gas channel 114b. In other words, the treatment modules 130 and 150 may supply the same surface treatment agent, the treatment modules 140 and 160 may supply the same surface treatment agent, but the two surface treatment agents are different from each other.

In other examples, the treatment modules 130 and 150 may supply different surface treatment agents, while the treatment modules 140 and 160 may supply the same surface treatment agent, and the surface treatment agent supplied by the treatment modules 140 and 160 is different from the surface treatment agents supplied by the treatment modules 130 and 150. For example, the processing module 130 may provide deposition reaction precursors, the processing module 140 may supply argon for blowing off the excess deposition reaction precursors, the processing module 150 may supply oxygen-containing reactants to react with the deposition reaction precursors on the substrates 200, and the processing module 160 may supply argon to blow off the excess oxygen-containing reactants and reaction by-products.

In some examples, the rotatable hollow prism 120 has an accommodation space 126 and many gas holes 128. The gas holes 128 pass through the main body 122, and can fluidly connect the accommodation space 126 and the chamber 112. For example, the gas holes 128 may pass through the partitions 122a, 122b, 122c, and 122d. In addition, the surface treatment apparatus 100 may further include a gas device 180. The gas device 180 may be disposed in the accommodation space 126, or may be disposed outside the chamber body 110 and fluidly connected to the accommodation space 126 through a pipeline. The gas device 180 can pump or supply gas to the accommodation space 126, such that gas curtains can be formed between the processing chambers 170a, 170b, 170c, and 170d through the accommodation space 126 and the gas holes 128. For example, the gas may flow from the accommodation space 126 to the chamber 112. In some exemplary examples, in addition to the partitions 122a, 122b, 122c, and 122d, the gas holes 128 may also be disposed above and below the substrate holders 124a, 124b, 124c, and 124d, such that gas curtains can be simultaneously formed above and below the substrate holders 124a, 124b, 124c, and 124d.

The gas curtains formed by jetting gas through the accommodation space 126 and the gas holes 128 can effectively isolate the processing chambers 170a, 170b, 170c, and 170d, such that the processing chambers 170a, 170b, 170c, and 170d are independent from each other. Therefore, It can prevent the surface treatment agents in different treatment chambers 170a, 170b, 170c, and 170d from mixing, thereby improving the quality and speed of the surface treatment.

In the surface treatment of the substrates 200, the rotatable hollow prism 120 of the surface treatment apparatus 100 can clockwise rotate in the chamber 112, for example. In each rotation cycle, the processing chambers 170a, 170b, 170c, and 170d pass through four gas channels 114a, 114b, 114c, and 114d, and the processing modules 130, 140, 150, and 160 respectively apply the surface treatment agents to the substrates 200 in the processing chambers 170a, 170b, 170c, and 170d. For example, when the rotatable hollow prism 120 rotates once, the processing chamber 170a can pass through the gas channels 114b, 114c, and 114d in sequence from the gas channel 114a, and then return to the gas channel 114a, and the substrate 200 in the processing chamber 170a is sequentially applied with the surface treatment agents by the processing modules 130, 140, 150, and 160. When the surface treatment agents are applied by the treatment modules 130, 140, 150, and 160, the gas curtains between the processing chambers 170a, 170b, 170c, and 170d can separate the surface treatment agents in the adjacent two of the processing chambers 170a, 170b, 170c, and 170d.

The rotatable hollow prism 120 includes plural substrate holders 124a, 124b, 124c, and 124d arranged around the main body 122, such that plural substrates 200 can be carried thereon. During the rotation of the rotatable hollow prism 120 in the chamber 112, surface treatment can be performed on the substrates 200 at the same time, thereby greatly enhancing the efficiency of the surface treatment. In addition, the rotation axis of the rotatable hollow prism 120 may be non-parallel to the normal lines of the carrying surfaces of the substrate holders 124a, 124b, 124c, and 124d, such that positions on the substrates 200 carried by the substrate holders 124a, 124b, 124c, and 124d may have almost the same distance from the central axis of rotation and the same radius of rotation, and the rotation frequency of positions of the substrates is completely consistent with the rotation frequency of the rotatable hollow prism 120. Therefore, the moving speeds of the positions on the substrate 200 may be almost the same, which can enhance the uniformity of the surface treatment of the substrates 200. In addition, the three-dimensional structure of the overall design is very compact, and the space utilization rate is extremely high, so the occupied foot-print area is greatly reduced. Especially, as the length of the rotatable hollow prism 120 is increased or plural rotatable hollow prisms 120 are stacked, the number of the substrates that are carried can be increased proportionally without increasing the footprint, such that the utilization efficiency of space is increased.

In some examples, the surface treatment apparatus 100 may include one or more gas pumping devices. Before the processing chambers 170a, 170b, 170c, and 170d enter the gas supply range of the next one of the gas channels 114a, 114b, 114c, and 114d, the pumping devices can be used to pump out the excess surface treatment agent and the by-products of the surface treatment from the processing chambers 170a, 170b, 170c, and 170d. Thus, the number of the pumping devices may be the same as the number of the gas channels 114a, 114b, 114c, and 114d. In the example shown in FIG. 1, the surface treatment apparatus 100 includes four pumping devices 190a, 190b, 190c, and 190d. The pumping devices 190a, 190b, 190c, and 190d pass through the chamber body 110. The pumping device 190a is located between the adjacent gas channels 114a and 114b, the pumping device 190b is located between the adjacent gas channels 114b and 114c, the pumping device 190c is located between the adjacent gas channels 114c and 114d, and the pumping device 190d is located between the adjacent gas channels 114d and 114a. Therefore, during each of the substrates 200 rotates away from the gas channel which is originally faced by the substrate 200 and reaches the gas channel which is faced next by the substrate 200, a gas pumping action is performed on the processing chamber where the substrate 200 is located. For example, during the substrate 200 in the processing chamber 170a rotates clockwise and leaves the gas channel 114a to reach the next gas channel 114b, the processing chamber 170a will undergo a gas pumping action.

In some examples, the surface treatment apparatus 100 may optionally include a heating device 300. For example, the heating device 300 may be disposed in the accommodation space 126 of the rotatable hollow prism 120. The heating device 300 can heat the substrates 200 according to the surface treatment requirements.

Figure 2:
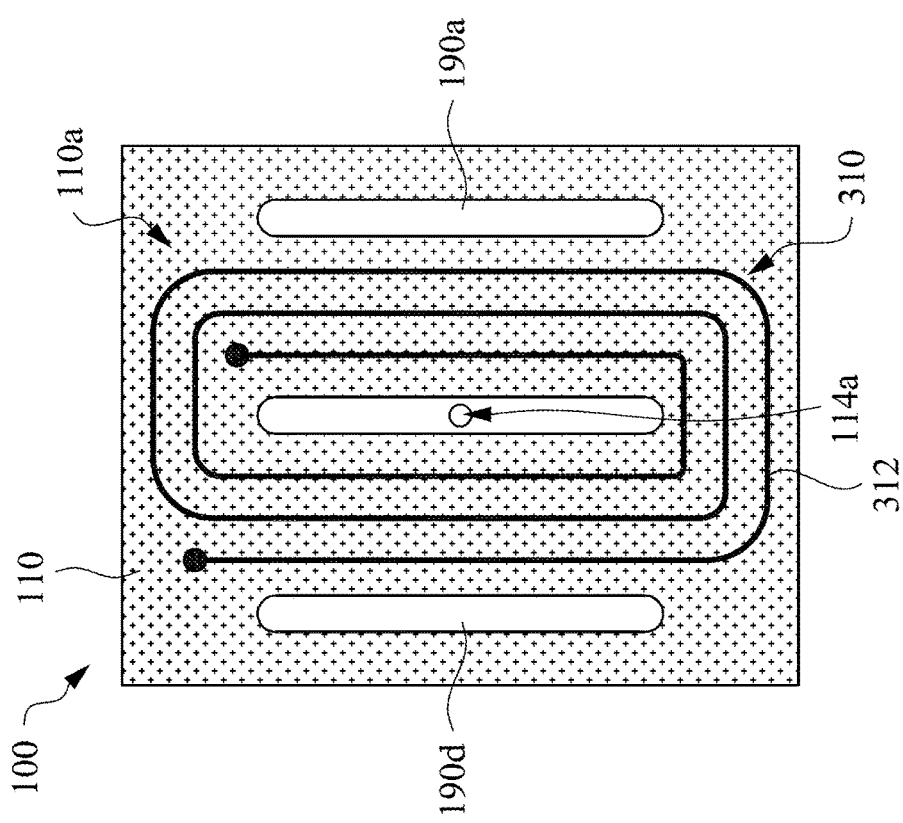
FIG. 2 is a diagram showing a configuration of a plasma device of the surface treatment apparatus along a cross-sectional line A-A of FIG. 1.

In some examples, the surface treating apparatus 100 may optionally include a single or more activation devices. Referring to FIG. 2 simultaneously, FIG. 2 is a diagram showing a configuration of a plasma device of the surface treatment apparatus along a cross-sectional line A-A of FIG. 1. The surface treatment apparatus 100 may include four activation devices 310. The activation devices 310 may be respectively disposed on the inner side 110a of the chamber body 110, and respectively correspond to the adjacent gas channels 114a, 114b, 114c, and 114d. The activation device 310 may provide thermal energy, plasma, and/or electromagnetic radiation. For example, the activation devices 310 may heat the substrates 200 and generate plasma to dissociate the surface treatment agents. In the example shown in FIG. 2, each of the activation devices 310 includes a coil 312, and the coils 312 are respectively wound around the corresponding gas channels 114a, 114b, 114c, and 114d.

In other examples, the chamber body 110 may be a non-conductive chamber body, and a coil may be wound around the non-conductive chamber body as an activation device. The coil may be connected to a high-frequency power supply to generate induction heating or inductively coupled plasma in the chamber body. In some exemplary examples, a frequency of the high-frequency power supply is smaller than 10 KHz.

In some examples, the surface treatment apparatus 100 may optionally include a single plasma device. The plasma device surrounds the inner side surface of the chamber body 110 in a spiral shape, or surrounds the outside of the chamber body 110. The plasma device can heat the substrates 200 and generate plasma to dissociate the surface treatment agents.

Figure 3:
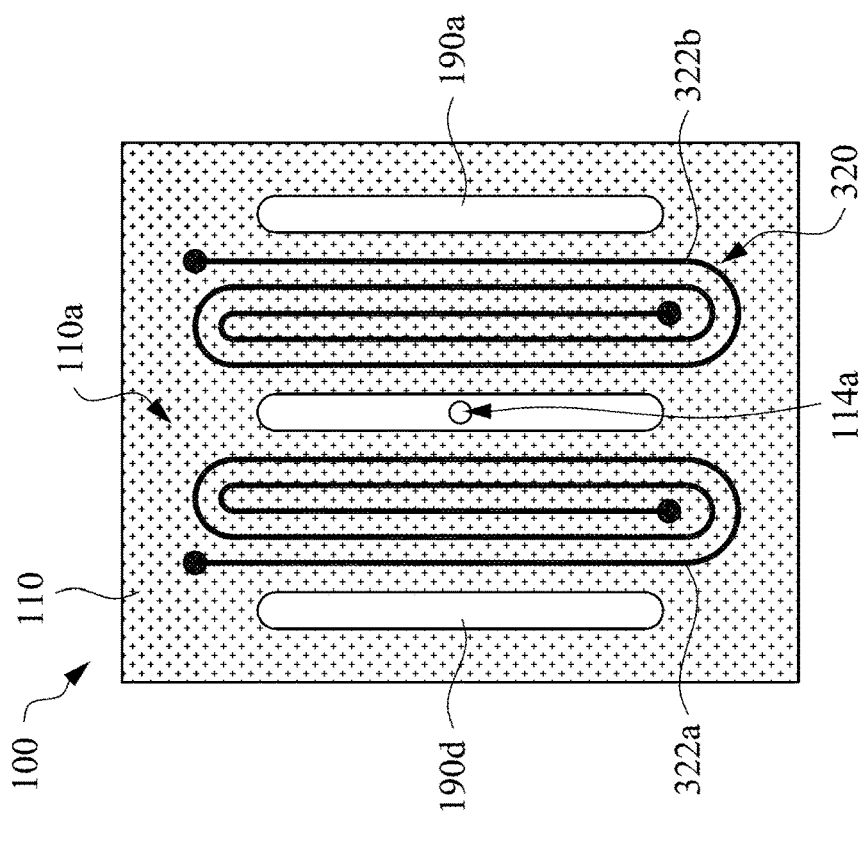
FIG. 3 is a diagram showing a configuration of another plasma device of the surface treatment apparatus along a cross-sectional line A-A of FIG. 1.

Referring to FIG. 3, FIG. 3 is a diagram showing a configuration of another plasma device of the surface treatment apparatus along a cross-sectional line A-A of FIG. 1. A plasma device 320 includes two coils 322a and 322b. The coils 322a and 322b are respectively arranged on opposite sides of the corresponding one of the gas channels 114a, 114b, 114c, and 114d. For example, the coil 322a is arranged between one side of the gas channel 114a and the pumping device 190d, and the coil 322b is arranged between the opposite side of the gas channel 114a and the pumping device 190a.

Figure 4:
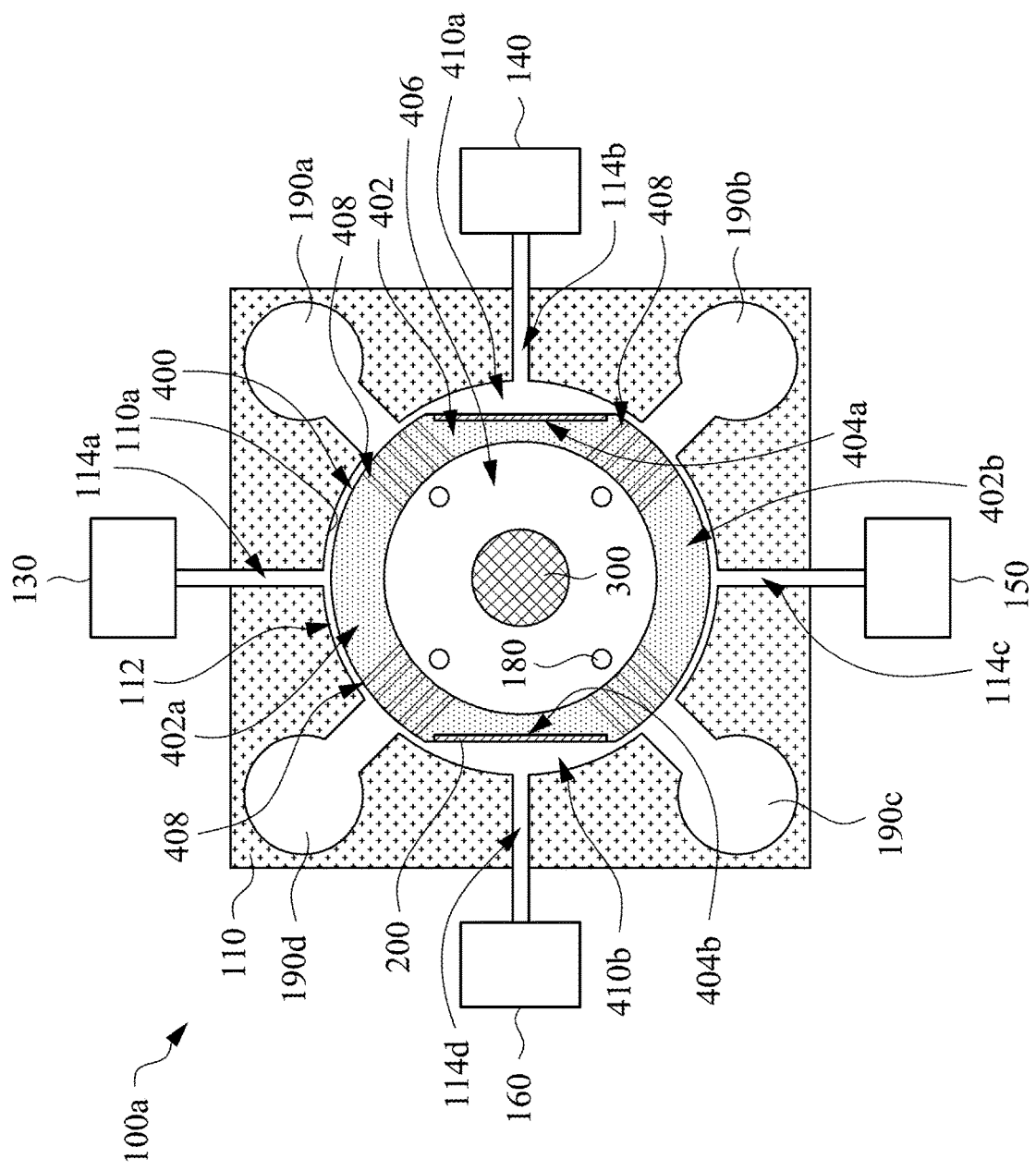
FIG. 4 is a schematic diagram of a surface treatment apparatus in accordance with one embodiment of the present disclosure.

The hollow prism of the surface treatment apparatus of the present disclosure may be of different types, such that the surface treatment apparatus may have different numbers of processing chambers. Referring to FIG. 4, FIG. 4 is a schematic diagram of a surface treatment apparatus in accordance with one embodiment of the present disclosure. A device structure of a surface treatment apparatus 100a is substantially the same as that of the above-mentioned surface treatment apparatus 100. A difference between the two is that a main body 402 of a rotatable hollow prism 400 of the surface treatment apparatus 100a only includes two partitions 402a and 402b, and the rotatable hollow prism 400 only includes two substrate holders 404a and 404b.

In the surface treatment apparatus 100a, the partitions 402a and 402b are located on two opposite sides of the main body 402, and the substrate holders 404a and 404b are also located on two opposite sides of the main body 402. The partitions 402a and 402b are both located between the substrate holders 404a and 404b, and separate the substrate holders 404a and 404b. That is, the partition 402a, the substrate holder 404a, the partition 402b, and the substrate holder 404b are arranged in a clockwise direction. Similarly, the distance between the substrate holders 404a and 404b and the inner side surface 110a of the chamber body 110 is greater than the distance between the partitions 402a and 402b and the inner side surface 110a of the chamber body 110.

In addition, a normal line of a carrying surface of each of the substrate holders 404a and 404b is not parallel to a rotation axis of the rotatable hollow prism 400. In some exemplary examples, the normal line of the carrying surface of each of the substrate holders 404a and 404b is substantially non-parallel to the rotation axis of the rotatable hollow prism 400. Similarly, each of the substrate holders 404a and 404b can define processing spaces 410a and 410b with the inner side surface 110a of the chamber body 110.

The rotatable hollow prism 400 may similarly have an accommodation space 406 and plural gas holes 408. The gas holes 408 pass through the main body 402, and can fluidly connect the accommodation space 406 and the chamber 112. For example, the gas holes 408 may pass through the partitions 402a and 402b, and adjacent to the substrate holders 404a and 404b. In addition, the surface treatment apparatus 100a may similarly include a gas device 180, which is fluidly connected to the accommodation space 406. The gas device 180 can form a gas curtain between the processing chambers 410a and 410b through the accommodation space 406 and the gas holes 408 by pumping or supplying gas to the accommodation space 406. In some exemplary examples, the gas holes 408 may also be disposed above and below the substrate holders 404a and 404b, such that gas curtains may be formed above and below the substrate holders 404a and 404b simultaneously.

The surface treatment apparatus of the present disclosure may include plural rotatable hollow prisms, and the hollow prisms may be stacked on each other in the chamber body. For example, as shown in FIG. 1, the chamber body 110 may have one single chamber 112, and plural rotatable hollow prisms 120 are stacked with each other in the chamber 112. In other examples, the chamber body 110 may have plural chambers 112 vertically arranged, and the rotatable hollow prisms 120 may be respectively disposed in the chambers 112. The surface treatment apparatus may be equipped with plural rotatable hollow prisms stacked on each other, such that there are plural substrate holders stacked on each other, and the number of the substrate holders is proportional to the number of the stacked hollow prisms. Therefore, when the hollow prisms rotate, the surface treatment can be performed on more substrates at the same time, thereby greatly enhancing the efficiency and the production capacity of the surface treatment apparatus.

According to the aforementioned embodiments, one advantage of the present disclosure is that a rotatable hollow prism of a surface treatment apparatus of the present disclosure includes plural substrate holders disposed around its main body, such that plural substrates can be carried and processed at the same time. When the substrate holders rotate in the chamber body, the surface treatment can be performed on the substrates at the same time, such that the efficiency of the surface treatment can be greatly enhanced.

According to the aforementioned embodiments, another advantage of the present disclosure is that a rotation axis of the substrate holders of the surface treatment apparatus is not parallel to a normal line of a carrying surface of the substrate holder, such that the structure of the apparatus is simple and small, and the footprint is small, which can make the planning of the plant space more flexible to enhance the space efficiency of the plant. In addition, the surface treatment apparatus can include plural stacked substrate holders, such that the surface treatment can be performed on more substrates at the same time, thereby greatly enhancing the efficiency and the production capacity of the surface treatment apparatus.

According to the aforementioned embodiments, still another advantage of the present disclosure is that the rotation axis of the substrate holder is not parallel to the normal line of the carrying surface of the substrate holder, such that positions on the substrates carried by the substrate holders may have almost the same radius of rotation, and the same rotation frequency as that of the rotatable hollow prism. Accordingly, there is no speed difference among the positions on the substrates, which can ensure high surface treatment uniformity on the same substrate and among the different substrates, and avoid waste of the processing space.

According to the aforementioned embodiments, yet another advantage of the present disclosure is that the substrate holders of the surface treatment apparatus can form processing chambers with an inner wall of the chamber body, and many gas holes are arranged on the inner wall of the chamber body, and gas inlets and gas outlets are arranged on the wall of the chamber body in place, such that the processing chambers can be quickly filled and cleaned at the same time. In addition, the jet air curtains are provided, such that the processing chambers are effectively isolated to prevent the surface treatment agents in different chambers from mixing. The steps are very important to the increase of the rate of the surface treatment. Because if the rotation speed of the substrates is increased to increase the rate of the surface treatment, the gas that has been reacted in the previous step is likely to remain in the next step, which results in gas mixing, such that the surface reaction mechanism is changed thus inducing the deterioration of the quality of surface treatment. Therefore, the design of the present disclosure can effectively clean and isolate the processing chambers when the substrates rotate at an increased speed, which can prevent the gases from mixing, such that the rate of the surface treatment can be effectively increased while maintaining high quality.

According to the aforementioned embodiments, further another advantage of the present disclosure is that after the shape of the rotatable hollow prism is properly designed, the volume of the processing chambers formed by the rotatable hollow prism and the wall of the chamber body can be minimized. That is, the minimum value that can be achieved when using flat substrates, such that the time required for the gas to enter the chambers and be purged can be significantly decreased. Therefore, the smallest volume of the processing chambers facilitates the increase of the rotation rate of the processing chambers while maintaining complete surface reactions and avoiding the remaining of the gas. Accordingly, a high quality surface treatment is achieved even when the rate of the surface treatment is increased to the highest value.

It can be known from the aforementioned embodiments that the present disclosure is not only applicable to atomic layer deposition, but also applicable to atomic layer etching. Because the principles of the two are very similar, they both use multiple cycles to carry out the surface treatment step, and each cycle only processes one atomic layer. The difference is that the former is for coating and the latter is for etching. Both of them have to avoid the mixing of gases in different steps.

Although the present disclosure has been disclosed above with embodiments, it is not intended to limit the present disclosure. Any person having ordinary skill in the art can make various changes and modifications without departing from the spirit and scope of the present disclosure. Therefore, the protection scope of the present disclosure should be defined by the scope of the appended claims.

What is claimed is:

1. A surface treatment apparatus, comprising:
a chamber body having a chamber and a plurality of gas channels, wherein the gas channels pass through the chamber body, surround the chamber, and are fluidly connected to the chamber;
at least one rotatable hollow prism disposed in the chamber, wherein the at least one rotatable hollow prism comprises:
a main body comprising a plurality of partitions; and
a plurality of substrate holders disposed on an outer side surface of the main body and configured to hold a plurality of substrates, wherein the partitions are respectively located between the adjacent substrate holders, and each of the substrate holders and an inner side surface of the chamber body define a processing chamber; and
a plurality of processing modules configured to supply a plurality of surface treatment agents to the processing chambers respectively through the gas channels,
wherein a normal line of a carrying surface of each of the substrate holders is non-parallel to a rotation axis of the at least one rotatable hollow prism,
when a surface treatment process is performed, the at least one rotatable hollow prism rotates, such that each of the substrates is sequentially exposed to the surface treatment agents, wherein during each of the substrates rotates away from the gas channel which is originally faced by the substrate and reaches the gas channel which is faced next by the substrate, an gas pumping action is performed on the processing chamber where the substrate is located.

2. The surface treatment apparatus of claim 1, further comprising at least one gas pumping device passing through the chamber body and located between adjacent two of the gas channels.

3. The surface treatment apparatus of claim 1, further comprising a gas device, wherein the at least one rotatable hollow prism has an accommodation space and a plurality of gas holes, the gas holes pass through the main body and fluidly connect the accommodation space and the chamber, gas flows from the accommodation space to the chamber, the gas device is configured to form a plurality of gas curtains between the processing chambers via the accommodation space and the gas holes to isolate the processing chambers to prevent the surface treatment agents in the processing chambers from mixing with each other.

4. The surface treatment apparatus of claim 1, wherein the surface treatment agents are the same or different from each other.

5. The surface treatment apparatus of claim 1, further comprising a heating device, wherein the at least one rotatable hollow prism has an accommodation space, and the heating device is disposed in the accommodation space and is configured to heat the substrates.

6. The surface treatment apparatus of claim 1, further comprising one single activation device or a plurality of activation devices, wherein the activation devices can provide thermal energy, plasma, or electromagnetic radiation, and are disposed in the chamber adjacent to the gas channels.

7. The surface treatment apparatus of claim 1, wherein a number of the at least one rotatable hollow prism is plural, and the rotatable hollow prisms are stacked on each other.

8. The surface treatment apparatus of claim 1, wherein the chamber body is a non-conductive chamber body, and the surface treatment apparatus comprises a coil surrounding the non-conductive chamber body, and the coil is configured to be connected to a high-frequency power supply to generate inductive heating or inductively coupled plasma in the chamber body, wherein a frequency of the high-frequency power supply is less than 10 KHz.

* * * * *